United States Patent
Kao et al.

(10) Patent No.: US 7,560,309 B1
(45) Date of Patent: Jul. 14, 2009

(54) DROP-IN HEAT SINK AND EXPOSED DIE-BACK FOR MOLDED FLIP DIE PACKAGE

(75) Inventors: Huahung Kao, San Jose, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 228 days.

(21) Appl. No.: 11/188,661

(22) Filed: Jul. 26, 2005

(51) Int. Cl.
*H01L 21/00* (2006.01)

(52) U.S. Cl. ............... 438/122; 438/127; 257/E23.051

(58) Field of Classification Search ......... 438/122–125, 438/106, 112, 127; 257/778, 673, 675, 796, 257/706–707, E23.051
See application file for complete search history.

(56) References Cited

U.S. PATENT DOCUMENTS

| | | | | |
|---|---|---|---|---|
| 5,147,821 A | * | 9/1992 | McShane et al. | 264/272.17 |
| 5,244,838 A | * | 9/1993 | Casati et al. | 29/827 |
| 5,328,870 A | | 7/1994 | Marrs | |
| 5,376,587 A | * | 12/1994 | Buchmann et al. | 438/122 |
| 5,378,924 A | | 1/1995 | Liang | |
| 5,387,554 A | | 2/1995 | Liang | |
| 5,442,234 A | | 8/1995 | Liang | |
| 5,455,462 A | | 10/1995 | Marrs | |
| 5,471,366 A | * | 11/1995 | Ozawa | 361/704 |
| 5,514,613 A | * | 5/1996 | Santadrea et al. | 438/15 |
| 5,728,606 A | * | 3/1998 | Laine et al. | 438/122 |
| 5,789,270 A | | 8/1998 | Jeng et al. | |
| 5,986,340 A | | 11/1999 | Mostafazadeh et al. | |
| 6,075,288 A | | 6/2000 | Akram | |
| 6,121,103 A | * | 9/2000 | Tully et al. | 438/381 |
| 6,159,764 A | | 12/2000 | Kinsman et al. | |
| 6,268,239 B1 | * | 7/2001 | Ikeda | 438/122 |
| 6,330,158 B1 | | 12/2001 | Akram | |
| 6,432,840 B1 | * | 8/2002 | Hembree | 438/759 |
| 6,699,731 B2 | * | 3/2004 | Huang et al. | 438/108 |
| 6,720,650 B2 | * | 4/2004 | Miyazaki | 257/707 |
| 6,770,513 B1 | | 8/2004 | Vikram et al. | |
| 2006/0099742 A1 | * | 5/2006 | Hochstenbach et al. | 438/127 |

OTHER PUBLICATIONS

Design Summary for Quad Float No-Lead Logic, Texas Instruments, 2004.
Logic Packaging: QFN, http://focus.ti.com/logic/docs/generalcontent.tsp?templateld=5985&navigationld=11390..., 1995.
Mortan, Frank, et al., Quad Flatpack No-Lead Logic Packages, Texas Instruments, Application Report, SCBA017D—Feb 2004.
Logic Packaging: QFN, QFN Design Summary/Planet Analog QFN Coverage, http://focus.ti.com/logic/docs/generalcontent.tsp?templateld=5985&navigationld=11390..., 1995.

(Continued)

*Primary Examiner*—David A Zarneke
*Assistant Examiner*—Jenny L Wagner

(57) ABSTRACT

A system and method for modifying a molded flip die (MFD) integrated circuit package that includes an integrated circuit die to include a heat sink such that the heat sink is thermally coupled to either a top or bottom portion of the integrated circuit die and can then dissipate heat to ambient air. The system and method presented herein modify the MFD package by either removing portions of a molding material and attaching the heat sink directly to the die, or thermally coupling the heat sink to the die prior encapsulation of the integrated circuit die and heat sink.

14 Claims, 11 Drawing Sheets

OTHER PUBLICATIONS

Juskey, Frank, "CommsDesign: QFN packages quell noise, cost, space in handhelds," Multiprotocol Transport Solutions—Metro Ethernet Services, http;//www.commsdesign.com/printable Article/;jsessionid=BYZL203Z2KQLUQSNDBCC..., Aug. 26, 2002.

* cited by examiner

RELEVANT ART

DROP-IN HEAT SINK AND EXPOSED DIE-BACK FOR MOLDED FLIP DIE PACKAGE

BACKGROUND

1. Field of the Invention

The present invention relates to a system and method for dissipating excess heat from integrated circuit semiconductors. More particularly, the present invention relates to a system and method for dissipating excess heat through the use of externally and internally located heat sinks for molded flip die (MFD) packaged integrated circuits.

2. Background Information

An integrated circuit (IC) package is a structure used to electrically connect an IC die (die) to a printed circuit board (PCB) or other host structure. Each die typically includes input/output (I/O) terminals which are arranged along a peripheral edge of the die. After the die is mounted on a package, the I/O terminals are electrically connected to bonding pads formed on the package using, for example, wire bond techniques.

In order to maintain a reasonable service life of an IC device, the operating temperature of the device must be carefully controlled by providing adequate heat dissipation. To keep pace with the developments in IC fabrication, there is an on-going need for IC packages having improved thermal characteristics. The term "thermal characteristics" is used herein to refer to a package's ability to dissipate a large amount of heat generated during operation of the die such that the die is maintained at an optimal operating temperature.

A conventional plastic semiconductor package includes a semiconductor die wire bonded to a lead frame, and encapsulated in a plastic body. One consideration in designing a plastic package is heat transfer from the die. In a conventional plastic semiconductor package, the bulk of heat transfer from the encapsulated die is through the terminal leads of the package. However, as circuit densities increase, semiconductor die generate additional heat, and the leads of the package are not always able to efficiently dissipate the heat.

The higher power consumption circuits in modern IC devices creates the need for improved heat dissipation. A heat sink normally made of a high thermal conductive material has been used to fulfill the need for improving heat dissipation in plastic molded packages. A heat sink is typically made of a material that has high thermal conductivity such as copper, copper alloys, aluminum, aluminum alloys or any other high thermal conductive materials. The heat sink ideally should be in good thermal contact to a semiconductor die.

FIG. 1 illustrates a cross sectional view of a conventional molded flip die (MFD) IC 2. Use of the solder balls 20 between the die 22 and the lead pads 6 provides the electrical path between external circuits, components (passive and resistive), I/O connectors, and other devices, and the internal circuitry of the die 22. Each solder ball 20 is in electrical communication with at least one internal connector, or terminal, of the die 22. Encapsulating the die 22, solder balls 20, and several sides of the lead pads 6 is an encapsulating or molding material 12. The molding material 12 can be a ceramic material, although an epoxy-resin based material (plastic) can be used that saves weight and reduces costs. Plastic, however, is not as good a thermal conductor as ceramic, and MFD ICs 2 (and other types as well) can be required to dissipate 5, 10 or even up to 20 watts of power.

Because of its small size, increasing numbers of MFD packages can be located on a PCB, increasing the amount of heat need to be dissipated by the PCB per given area. Thus, a need exists for an improved MFD package that can dissipate greater amounts of heat.

SUMMARY OF THE INVENTION

A system and method for modifying a molded flip die (MFD) integrated circuit package that includes an integrated circuit die to include a heat sink such that the heat sink is thermally coupled to either a top or bottom portion of the integrated circuit die and can then dissipate heat to ambient air. The system and method presented herein modify the MFD package by either removing portions of a molding material and attaching the heat sink directly to the die, or thermally coupling the heat sink to the die prior encapsulation of the integrated circuit die and heat sink.

According to a first aspect of the present invention, a method of manufacturing a molded integrated circuit (IC) flip die package comprises the steps of: (a) providing a molded IC flip die encapsulated with molding material; (b) exposing a surface of an integrated circuit die in the molded IC flip die package; and (c) thermally coupling a heat sink to the exposed surface of the integrated circuit die.

According to the first aspect, the step of providing the molded IC flip die encapsulated with molding material comprises the step of: (d) providing the molded IC flip die comprising a first surface, portions of which are in electrical contact with one or more lead pads, and a second surface opposed to the first surface. The step of exposing the surface of the integrated circuit die in the molded IC flip die package comprises: (e) selectively removing a portion of the molding material to expose the second surface of the integrated circuit die. The step of selectively removing a portion of the molding material to expose the second surface of the integrated circuit die comprises: (f) abrading the molding material to selectively remove a portion of the molding material to expose the second surface of the integrated circuit die. The step of abrading the molding material comprises: (g) abrading the molding material initially with a coarse grit abrasion material; (h) and abrading the molding material subsequently with a finer grit abrasion material to selectively remove a portion of the molding material to expose the second surface of the integrated circuit die. The step of selectively removing the portion of the molding material to expose the second surface of the integrated circuit die comprises: (i) selectively removing the portion of the molding material with a removing apparatus selected from the group consisting of a laser, a drill, and one or more chemicals to expose the first surface of the integrated circuit die. The step of selectively removing the portion of the molding material with a laser comprises: (j) ablating the portion of molding material with a laser. The step of selectively removing the portion of the molding material with a laser comprises: (k) shearing off the portion of molding material with a laser. The step of selectively removing a portion of the molding material with one or more chemicals comprises: (l) removably etching the portion of molding material with one or more chemicals.

According to the first aspect, the step of exposing the surface of the integrated circuit die in the molded IC flip die package comprises: (m) selectively removing a portion of the molding material to expose the first surface of the integrated circuit die. The step of selectively removing the portion of the molding material to expose the second surface of the integrated circuit die comprises: (n) selectively removing the portion of the molding material with a removing apparatus selected from the group consisting of a laser, a drill, and one or more chemicals to expose the first surface of the integrated circuit die. The step of selectively removing the portion of the molding material with a laser comprises: (o) ablating the portion of molding material with a laser. The step of selectively removing the portion of the molding material with a laser comprises: (p) shearing off the portion of molding material with a laser. The step of selectively removing a portion of the molding material with one or more chemicals comprises: (q) etching the portion of molding material with one or more chemicals.

According to the first aspect, the method further comprises: (r) electrically bonding the encapsulated integrated circuit package to a printed circuit board, wherein the heat sink is thermally coupled to the first surface of the integrated circuit die, such that the heat sink is in thermal contact with the printed circuit board. The step of thermally coupling a heat sink to the exposed integrated circuit die comprises: (s) attaching the heat sink to the integrated circuit die by thermally coupling selected from the group consisting of thermally adhering, thermally gluing, thermally taping, and mechanically coupling. The step of attaching the heat sink by mechanically coupling comprises: (t) press fitting the heat sink to the molded IC flip die package. The step of attaching the heat sink by mechanically coupling comprises: (u) screwing the heat sink to the molded IC flip die package. The method further comprises: (v) encapsulating the integrated circuit die coupled to the heat sink with a molding material. The molded IC flip die package can be selected from the group consisting of a ball gate array and a quad flat no-lead package. The heat sink can be made of a material selected from the group consisting of steel, a steel alloy, aluminum, and an aluminum alloy.

According to a second aspect of the present invention, a molded integrated circuit (IC) flip die comprises a molded IC flip die package comprising an integrated circuit die, a molding material encapsulating the integrated circuit die and other components of the molded IC flip die package, except for a portion selectively removed to expose a surface of the integrated circuit die, and a heat sink thermally coupled to the exposed surface of the integrated circuit die.

According to the second aspect, the molded IC flip die package comprises a first surface, portions of which are in electrical contact with one or more lead pads, and a second surface opposed to the first surface. The portion of the molding material is selectively removed to expose the first surface of the molded IC flip die. The molded flip die further comprises an electrical bonding agent that electrically connects the encapsulated integrated circuit package to a printed circuit board, wherein the heat sink is thermally coupled to the first surface of the integrated circuit die, such that the heat sink is in thermal contact with the printed circuit board. The selectively removed portion of the molding material to expose the first surface of the integrated circuit die is removed with a removing apparatus selected from the group consisting of a laser, a drill, and one or more chemicals to expose the first surface of the integrated circuit die. The selectively removed portion of the molding material to expose the first surface of the integrated circuit die is removed by ablating the portion of molding material with a laser. The selectively removed portion of the molding material to expose the first surface of the integrated circuit die is removed by shearing off the portion of molding material with a laser. The selectively removed portion of the molding material to expose the first surface of the integrated circuit die is removed by removably etching the portion of molding material with one or more chemicals.

According to the second aspect, the portion of the molding material is selectively removed to expose the second surface of the molded IC flip die. The portion of the molding material is selectively removed to expose the second surface of the molded IC flip die by abrasion. The portion of the molding material is selectively removed to expose the second surface of the molded IC flip die by abrading the molding material initially with a coarse grit abrasion material, and then abrading the molding material subsequently with a finer grit abrasion material to selectively remove a portion of the molding material to expose the second surface of the integrated circuit die. The selectively removed portion of the molding material to expose the second surface of the integrated circuit die is removed with a removing apparatus selected from the group consisting of a laser, a drill, and one or more chemicals to expose the first surface of the integrated circuit die. The selectively removed portion of the molding material to expose the second surface of the integrated circuit die is removed by ablating the portion of molding material with the laser. The selectively removed portion of the molding material to expose the second surface of the integrated circuit die is removed by shearing off the portion of molding material with a laser. The selectively removed portion of the molding material to expose the second surface of the integrated circuit die is removed by removably etching the portion of molding material with one or more chemicals.

According to the second aspect, the heat sink is thermally coupled to the surface of the integrated circuit die with a thermal coupler selected from the group consisting of a thermally conductive adhesive, a thermal glue, a thermally conductive tape, and a mechanical coupler. The mechanical coupler comprises press fitting of the heat sink to the molded IC flip die package. The mechanical coupler comprises screwing the heat sink to the molded IC flip die package. The heat sink can be made of a material selected from the group consisting of steel, a steel alloy, aluminum, and an aluminum alloy. The molded IC flip die package is selected from the group consisting of a ball gate array and a quad flat no-lead package. The molding material is selected from a group consisting of an epoxy resin, and a ceramic.

According to a third aspect of the present invention, a method of manufacturing a molded integrated circuit (IC) flip die package comprises: (a) providing a molded IC flip die; (b) thermally coupling a heat sink to a surface of the integrated circuit die; and (c) encapsulating the integrated circuit die thermally coupled to the heat sink with a molding material, except for an exposed portion of the heat sink.

According to the third aspect, the step of providing a molded IC flip die comprises: (d) providing the molded IC flip die comprising a first surface, portions of which are in electrical contact with one or more lead pads, and a second surface opposed to the first surface. The method further comprises: (e) electrically bonding the encapsulated integrated circuit package to a printed circuit board, wherein the heat sink is thermally coupled to the first surface of the integrated circuit die, such that the heat sink is in thermal contact with the printed circuit board. The step of thermally coupling a heat sink to a surface of the exposed integrated circuit die comprises: (f) thermally coupling the heat sink to the second surface of the integrated circuit die. The step of thermally coupling a heat sink to the integrated circuit die comprises: (g) attaching the heat sink to the integrated circuit die by thermally coupling selected from the group consisting of thermally adhering, thermally gluing, thermally taping, and mechanically coupling. The step of attaching the heat sink by mechanically coupling comprises: (h) press fitting the heat sink to the molded IC flip die package. The step of attaching the heat sink by mechanically coupling comprises: (i) screwing the heat sink to the molded IC flip die package. The method further comprises: (j) encapsulating the integrated circuit die coupled to the heat sink with a molding material. The molded IC flip die package is selected from the group consisting of a ball gate array and a quad flat no-lead package. The heat sink can be made of a material selected from the group consisting of steel, a steel alloy, aluminum, and an aluminum alloy.

According to a fourth aspect of the present invention, a molded integrated circuit (IC) flip die comprises a molded IC flip die package comprising an integrated circuit die, a heat sink thermally coupled to a surface of the integrated circuit die, and a molding material encapsulating the integrated circuit die, and the heat sink, except for an exposed portion of the heat sink.

According to the fourth aspect, the molded IC flip die further comprises a first surface, portions of which are in electrical contact with one or more lead pads, and a second surface opposed to the first surface. The molded flip die further comprises an electrical bonding agent that electrically connects the encapsulated integrated circuit package to a printed circuit board, wherein the heat sink is thermally coupled to the first surface of the integrated circuit die, such that the heat sink is in thermal contact with the printed circuit board. The heat sink is thermally coupled to the second surface of the integrated circuit die. The heat sink is thermally coupled to the surface of the integrated circuit die with a thermal coupler selected from the group consisting of a thermally conductive adhesive, a thermal glue, a thermally conductive tape, and a mechanical coupler. The mechanical coupler comprises press fitting of the heat sink to the molded IC flip die package. The mechanical coupler comprises screwing the heat sink to the molded IC flip die package. The heat sink can be made of a material selected from the group consisting of steel, a steel alloy, aluminum, and an aluminum alloy. The molded IC flip die package is selected from the group consisting of a ball gate array and a quad flat no-lead package. The molding material is selected from a group consisting of an epoxy resin, and a ceramic.

According to a fifth aspect of the present invention, a method of manufacturing a molded integrated circuit (IC) flip die package comprises: (a) providing a molded IC flip die encapsulated with molding material, wherein the molded IC flip die comprises a first surface, portions of which are in electrical contact with one or more lead pads, and a second surface opposed to the second surface, and wherein the encapsulating material does not completely encapsulate the integrated circuit die, leaving the second surface substantially exposed; and (b) thermally coupling a heat sink to the exposed surface of the integrated circuit die.

According to the fifth aspect, the step of thermally coupling a heat sink to the exposed integrated circuit die comprises: (c) attaching the heat sink to the integrated circuit die by thermally coupling selected from the group consisting of thermally adhering, thermally gluing, thermally taping, and mechanically coupling. The step of attaching the heat sink by mechanically coupling comprises: (d) press fitting the heat sink to the molded IC flip die package. The step of attaching the heat sink by mechanically coupling comprises: (e) screwing the heat sink to the molded IC flip die package. The method further comprises: (f) encapsulating the integrated circuit die coupled to the heat sink with a molding material. The molded IC flip die package is selected from the group consisting of a ball gate array and a quad flat no-lead package. The heat sink can be made of a material selected from the group consisting of steel, a steel alloy, aluminum, and an aluminum alloy.

According to a sixth aspect of the present invention, a molded integrated circuit (IC) flip die comprises a molded IC flip die package comprising an integrated circuit die, and wherein the molded IC flip die package further comprises a first surface, portions of which are in electrical contact with one or more lead pad, and a second surface opposed to the first surface, a molding material selectively encapsulating the integrated circuit die and other components of the molded IC flip die package, wherein the second surface of the integrated circuit die is substantially exposed, and a heat sink thermally coupled to the substantially exposed second surface of the integrated circuit die.

According to the sixth aspect, the heat sink is thermally coupled to the surface of the integrated circuit die with a thermal coupler selected from the group consisting of a thermally conductive adhesive, a thermal glue, a thermally conductive tape, and a mechanical coupler. The mechanical coupler comprises press fitting of the heat sink to the molded IC flip die package. The mechanical coupler comprises screwing the heat sink to the molded IC flip die package. The heat sink can be made of a material selected from the group consisting of steel, a steel alloy, aluminum, and an aluminum alloy. The molded IC flip die package is selected from the group consisting of a ball gate array and a quad flat no-lead package. The molding material is selected from a group consisting of an epoxy resin, and a ceramic.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Figure 2:
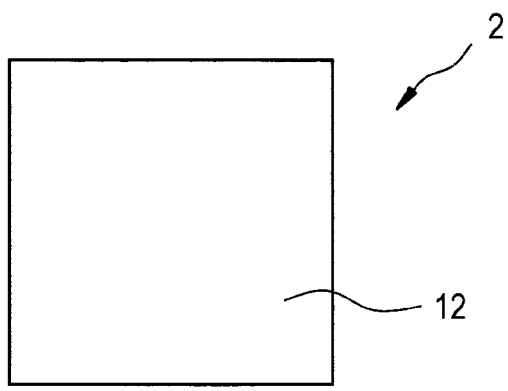
FIG. 2 illustrates a top view of a molded flip die package prior to implementing a method for attaching a heat sink to the molded flip die package according to an embodiment of the present invention.

As an effective and efficient means for dissipating the greater amounts of heat generated by the significant power consumption of the typical molded flip die integrated circuit (MFD IC) 2, as illustrated in, for example, FIG. 2, the systems and methods according to several exemplary embodiments of the present invention have been developed. Exemplary embodiments of the present invention are directed to a system and method for dissipating heat from a MFD IC 2 by locating a heat sink in a thermal conductive manner with the die. In a first exemplary embodiment, a top layer of a molding material that surrounds the die in a conventional MFD IC 2 is removed so that the top surface of the die is exposed. Once the top surface of the die is exposed, the heat sink is placed in thermal connection with the die through the use of thermal adhesives, thermal glue (and/or tape), by press fitting the heat sink against the top surface of the die, or by other suitable means. Alternatively, the conventional manufacturing process of the MFD IC 2 can be modified such that molding material does not completely encapsulate the die, but instead leaves the top surface of the die exposed, and then the heat sink can be located on the top surface of the die, in the same thermally conducting manner as discussed above.

According to an exemplary embodiment of the present invention, the MFD IC 2 can be embodied in at least several different types of integrated circuit packages. These include a quad flat no-lead package (QFN), a ball gate array (BGA) package, quad flat package (QFP), among others.

In a second exemplary embodiment of the present invention, the conventional manufacturing process for manufacturing the MFD IC 2 is modified such the heat sink is located on the top surface of the die prior to any encapsulation of the same by molding material. Generally, the heat sink that is located on the top surface of the die prior to encapsulation by molding material has physical dimensions such that the external footprint (i.e., width v. length) of a MFD IC 2 modified according to the second exemplary embodiment of the present invention can be the same as that of an unmodified conventional MFD IC 2. Alternatively, a conventional MFD IC 2 can be manufactured and then have a portion of a top layer of molding material removed such that a hole is created over the top surface die, wherein the heat sink can be located on the top surface of the die, in the same thermally conducting manner as discussed above.

In a third exemplary embodiment of the present invention, the conventional manufacturing process for manufacturing the MFD IC 2 is modified such the heat sink is located on the bottom surface of the die prior to any encapsulation of the same by molding material. The heat sink that is located on the bottom surface of the die prior to encapsulation by molding material has physical dimensions such that the heat sink is in thermal connection with not only the die, but also with the PCB when the MFD IC 2 is soldered to the PCB. Alternatively, a conventional MFD IC 2 can be manufactured and then have a portion of a bottom layer of the molding material removed such that a hole is created under the die, wherein the heat sink can be located on the bottom surface of the die, in the same thermally conducting manner as discussed above.

Figure 1:
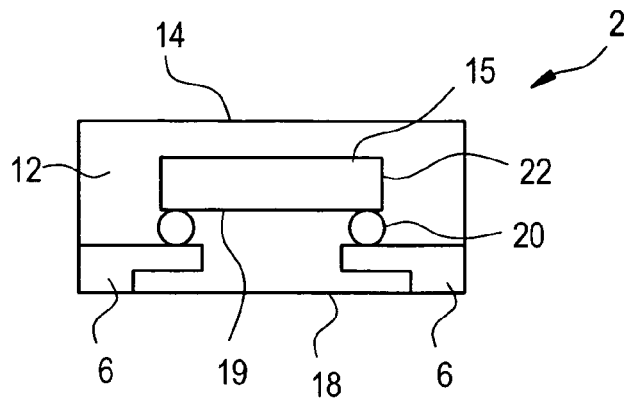
FIG. 1 illustrates a simplified cross sectional view of a molded flip die and package.
Figure 3:
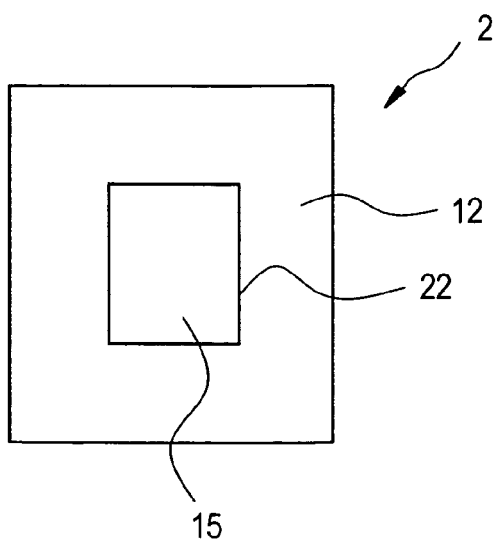
FIG. 3 illustrates the molded flip die package shown in FIG. 2 following removal of an uppermost layer of molding material, in accordance with an exemplary embodiment of the present invention.

These and other aspects of the present invention will now be described in greater detail. A first method for modifying the MFD IC 2 to dissipate greater amounts of heat is shown in reference to FIGS. 2-6, in accordance with an exemplary embodiment of the present invention. In FIG. 2, a MFD IC 2 is shown from a top view, prior to beginning the method according to an embodiment of the present invention. As can be seen in FIG. 1, the die 22 is completely covered with the molding material 12. Then, through one of several different processes, the molding material 12 is removed until the top surface 15 of the die 22 is visible as seen in FIG. 3.

One method for removing the molding material 12 is the use of an abrasive material to sand or grind the molding material 12 away. Generally, this occurs through the use of a course grit sanding apparatus, followed by a finer grit sanding apparatus to remove substantially all of the of molding material 12. Other processes can also be used. For example, chemicals can be used to etch away the molding material 12. These chemicals are well known to those of ordinary skill in the art of the present invention. For example, the MFD IC 2 can be held by a device, inverted, and dipped into a chemical solution that dissolves the molding material 12. Alternatively, the chemical solution can be sprayed on the top of the MFD IC 2 and the molding material 12 can be removed physically or by a spraying action. Alternatively, a laser can be used to burn or vaporize away the molding material 12, as well as shearing off the molding material 12 above the die 22. Such lasers are well known to those of ordinary skill in the art of the present invention. Combinations of any two or more of the above can be implemented to remove the molding material 12. One of ordinary skill in the art of the present invention can appreciate that many different methods for removing the molding material can be interchangeably used, and all are considered to be within the scope of the embodiments of the present invention.

In order to safely isolate the top surface 15 of the die 22 of the MFD IC 2, the type of material that comprises the molding material 12 should be known, as well as how the material will interact with the selected removal process, the internal dimensions of the MFD IC 2 and the like. For example, if a chemical solution is to be used to remove the molding material 12, the operator would need to know how much molding material 12 is to be removed (from the internal dimensions), and how long it will take to remove that much molding material 12 at the specific concentration, temperature and other like operating parameters. These processes are also well known to those skilled in the art of the present invention.

Figure 4:
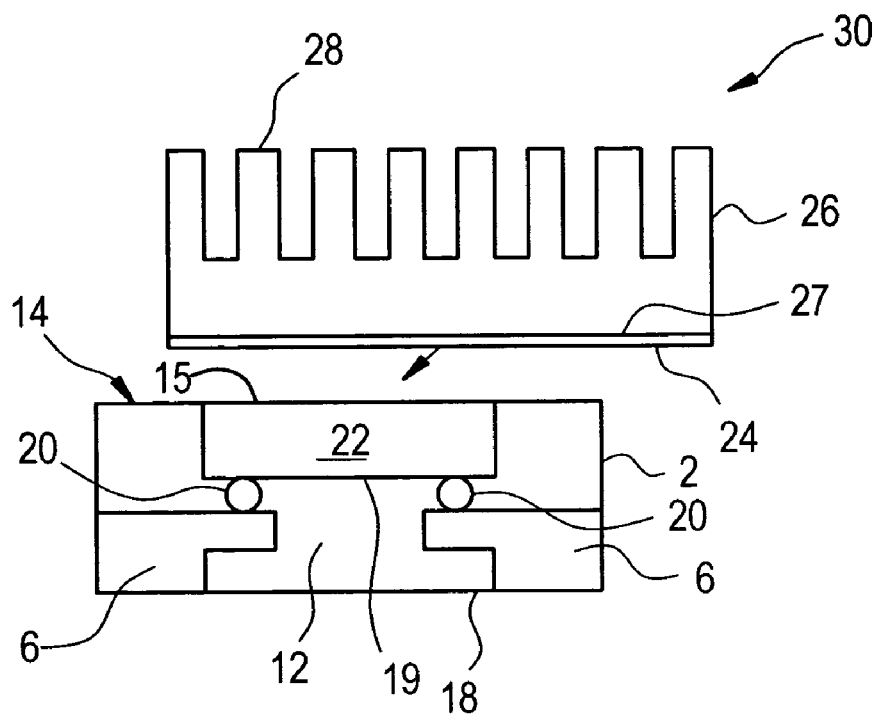
FIG. 4 illustrates a partial cross-sectional side view of the molded flip die package shown in FIGS. 2 and 3 with a heat sink being attached according to an embodiment of the present invention.

Referring now to FIG. 4, following the step of removal of the molding material 12 until the top surface 15 of the die 22 is exposed, a heat sink 26 can be attached to the die 22. Attaching the heat sink 26 can also be accomplished by many different methods, depending, in some instances, on the type of heat sink 26 to be used.

According to one embodiment of the present invention, a metal heat sink 26, is attached to the top surface 15 of the die 22 with a thermal adhesive 24. The metal heat sink 26 can be fabricated from aluminum, an aluminum alloy, steel, a steel alloy, or any other type of suitable metal (and in some circumstances, plastic). The thermal adhesive 24 can be a thermally conductive glue (e.g., sprayed or painted on the die 22) or tape, and provides both an adhering function and a thermal transfer function. If the thermal adhesive 24 provides a good thermal path to an efficient heat sink 26, the excess heat can be quickly and substantially dissipated by the heat sink 26.

Heat sinks 26 provide an excellent means for dissipating heat from objects that generate large quantifies of heat. As shown in FIG. 4, heat sinks can comprise a plurality of fins 26 that present multiple thermal conductive paths from the metal of which the heat sink 22 is made to the ambient air, although other thermally-efficient structures for the heat sink can also be used.

Other means, besides thermal adhesives 24, can also be used for attaching the heat sink 26 to the die 22. For example, the heat sink 26 can be press fitted to the top of the die 22 and surrounding molding material 12, or the heat sink 26 can be attached by mechanical attachment means. The mechanical attachment means can include screwing the heat sink 26 to the top of the die 22 and surrounding molding material 12, clamping the heat sink 26 onto the die 22, or the like.

Figure 5:
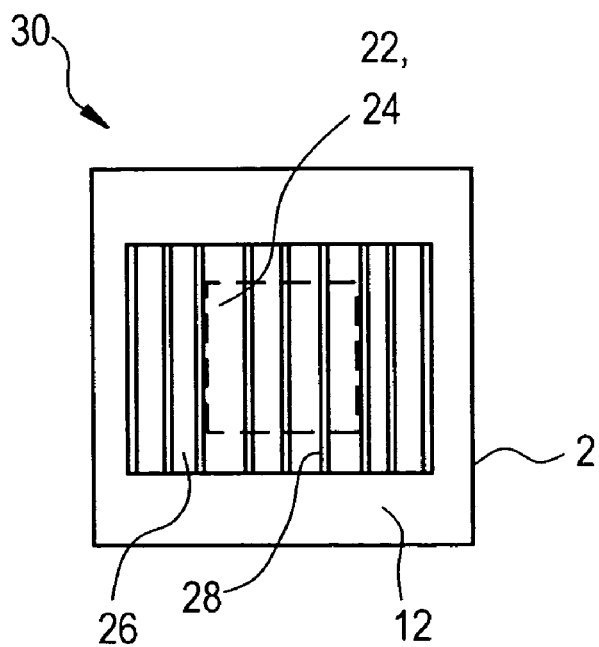
FIG. 5 illustrates a top view of the molded flip die package shown in FIG. 4 after the heat sink has been attached, in accordance with an exemplary embodiment of the present invention.

FIG. 4 illustrates a heat sink 26 being attached to the top surface 15 of the die 22 in accordance with an exemplary embodiment of the present invention. Thermal adhesive 24 is located on the bottom surface 27 of the heat sink 26, and then placed onto the top surface 15 of the die 22 and the top surface 14 of the MFD IC 2. This assembly is referred to as a first QFN IC heat sink assembly 30. FIG. 5 illustrates a top view of the first MFD IC heat sink assembly 30 in accordance with an exemplary embodiment of the present invention. The heat sink 26 can, but does not necessarily have to, cover the entire top of the MFD IC 2. The amount of coverage can depend on such features as the type of IC device, how much heat is intended to be dissipated, and other physical constraints, such as clearance dimensions. In some cases, the heat sink 26 can be larger than the entire top surface 14 of the MFD IC 2. As shown in FIG. 5, the die 22 can be generally centrally located under the heat sink 26 (although the die 22 can have any suitable orientation under the heat sink 26). Not shown in FIG. 5, but in this instance used, is thermal adhesive 24, although other means for thermally connecting the heat sink 26 can be used.

Figure 6:
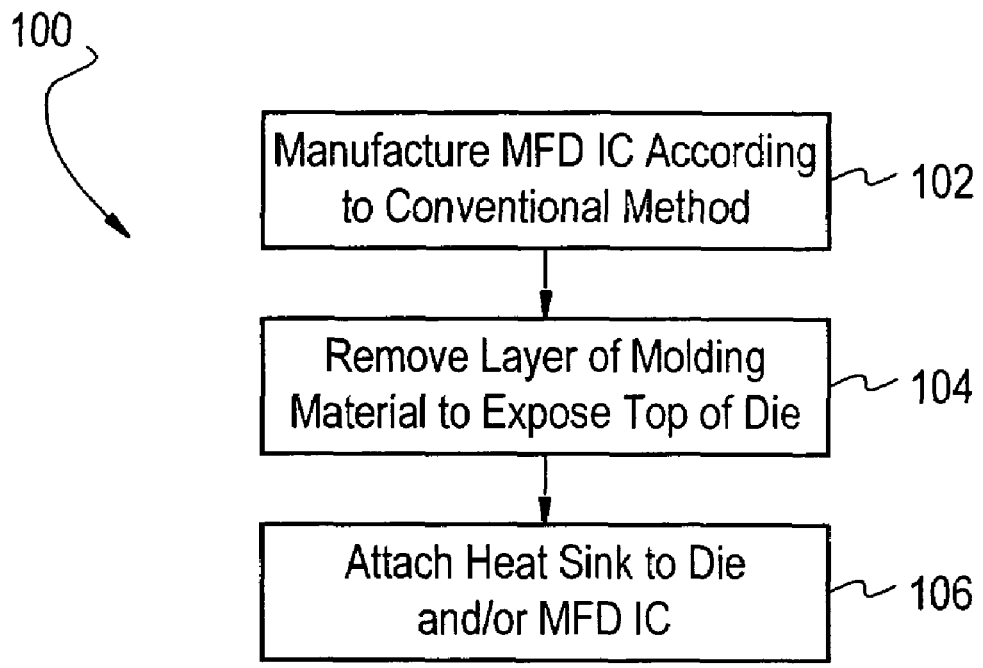
FIG. 6 illustrates a flow diagram of a method for attaching a heat sink to a die in a molded flip die package according to an embodiment of the present invention.

FIG. 6 illustrates a flow chart of a method 100 to attach a heat sink 26 to a die 22 in a MFD IC 2, according to an exemplary embodiment of the present invention. The method 100 represents a first method for creating the first MFD IC heat sink assembly 30, and begins with step 102, wherein the MFD IC 2 is manufactured according to a conventional manufacturing process (or provided to a user of the method 100). Then, in step 104, a top portion of the MFD IC 2 is removed, for example, by any one of the aforementioned means for removing molding material 12 from the MFD IC 2. As discussed above, the molding material 12 is removed until the top of the die 22 is exposed. Then, in step 106, the heat sink 26 is attached to the MFD IC 2 and/or die 22, using any suitable means for attaching the heat sink 26 to the MFD IC 2 and/or die 22, such as that discussed previously. One such method for attaching the heat sink 26 to the MFD IC 2 and/or die 22 is through the use of thermal attaching means that can include, for example, thermal adhesive, glue or tape, and mechanical attaching means (such as, for example, press fitting, screws, among other means).

Figure 7:
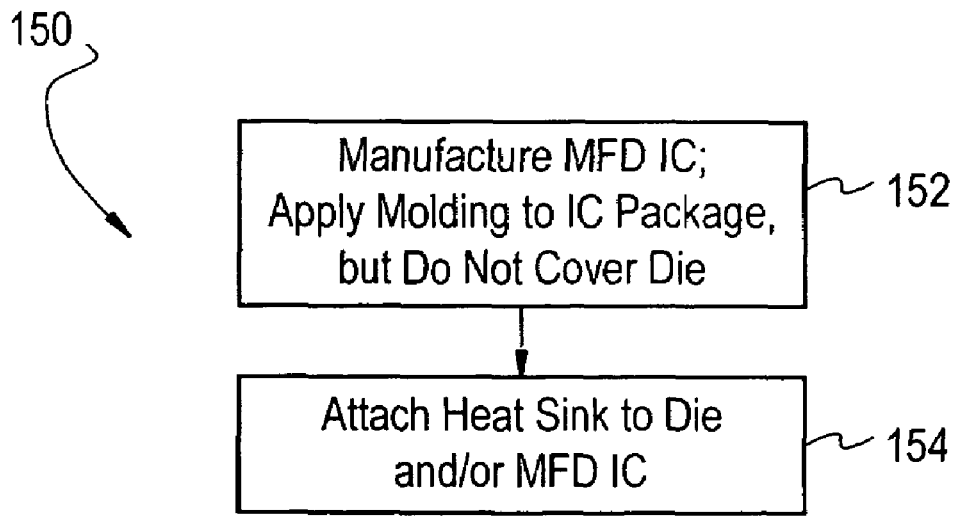
FIG. 7 illustrates a flow chart of a method for attaching a heat sink to a die in a molded flip die package according to an embodiment of the present invention.

FIG. 7 illustrates a flow chart of a method 150 to attach a heat sink 26 to a die 22 in a MFD IC 2 according to an alternative embodiment of the present invention. The method 150 represents a second method for manufacturing the first MFD IC heat sink assembly 30, and begins with step 152, wherein the MFD IC 2 is manufactured according to a conventional manufacturing process. In this alternative embodiment of the present invention, however, the die 22 is not covered by the molding material 12. The resulting MFD IC 2 would then be similar to the embodiment in which the molding material 12 is removed from a finished, normally manufactured MFD IC 2 that has had the top layer of molding material 12 removed, as discussed above in regard to FIG. 3 and step 104 of FIG. 6.

After the MFD IC 2 is manufactured according to step 152 such that the top surface 15 of the die 22 is left exposed (or provided to a user of method 150), the heat sink 24 is attached to the QFN IC 2 and/or die 22 in step 154, using any appropriate means for attaching the heat sink 24 to the QFN IC 2 and/or die 22, such as those discussed above.

Figure 8:
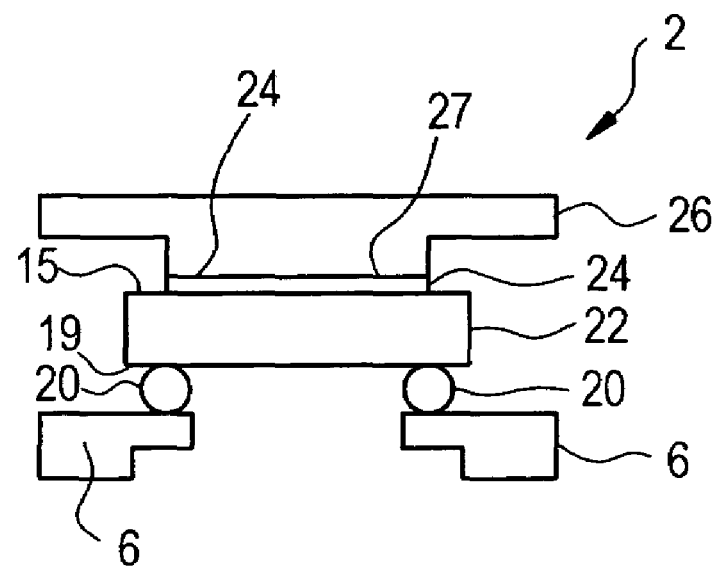
FIG. 8 illustrates a partial side view of a MFD IC package with a heat sink attached to a die in the molded flip die package according to an embodiment of the present invention.

FIGS. 8-14 illustrate a heat sink 26 attached to a die 22 in a MFD IC 2 according to an alternative embodiment of the present invention. In FIG. 8, the heat sink 26 is attached to a top or upper surface 15 of the die 22 prior to encapsulation with molding material 12. Although shown with thermal adhesive 24 applied between the bottom surface 27 of the heat sink 26 and the top surface 15 of the die 22, this may not always be the case, as discussed in regard to FIGS. 10 and 14. As shown in FIG. 8, however, thermal adhesive 24 has been applied to the bottom 27 of heat sink 26 to promote the efficient transfer of heat from the die 22 to the heat sink 26, so that heat can be dissipated into the air. Thus, FIG. 8 represents a MFD IC 2 manufacturing process modified to incorporate the step of adding the heat sink 26 and thermal adhesive 24 prior to the step of encapsulation.

Figure 9:
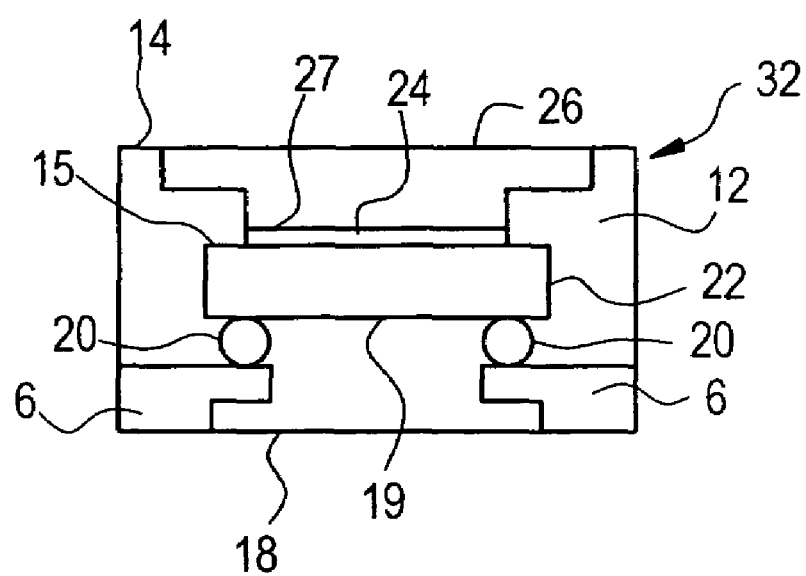
FIG. 9 illustrates the molded flip die package shown in FIG. 8 with molding material applied therein, in accordance with an exemplary embodiment of the present invention.

In FIG. 9, the assembled MFD IC 2 (from FIG. 8) is shown in a partial, cross-sectional, side view, with several of the internal lead connections omitted for purposes of clarity. Following the assembly of the heat sink 26 and thermal adhesive 24 to the die 22, the assembled integrated circuit device is encapsulated with molding material 12. The assembled heat sink 26 and MFD IC 2 is referred to as a second MFD IC heat sink assembly 32. The molding material 12 is added, in this embodiment, so that it is flush with the top of the heat sink 26. As one of ordinary skill in the art of the present invention can appreciate, however, this need not always be the case. In this particular exemplary embodiment of the present invention, the height of the heat sink 26 can be made to substantially match, after being attached to the top of the die 22, the height dimension of a conventional MFD IC 2.

Figure 10:
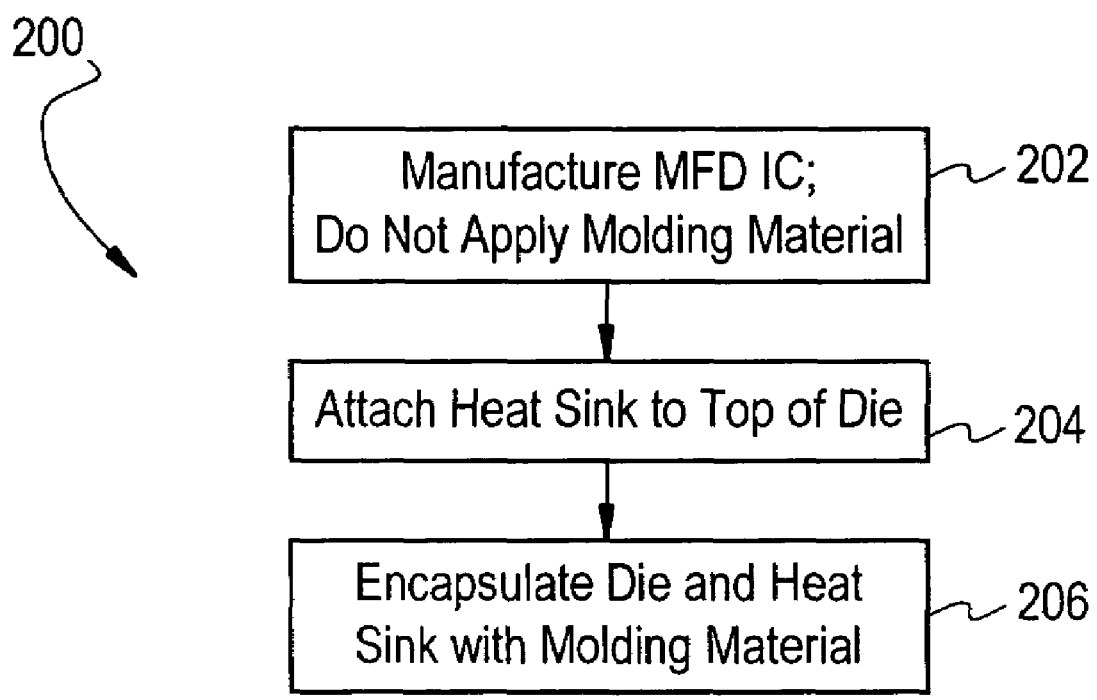
FIG. 10 illustrates a flow chart of a method for attaching a heat sink directly to a die in a molded flip die package prior to encapsulating the die and heat sink with molding material according to an embodiment of the present invention.

FIG. 10 illustrates a flow chart of a method 200 to attach a heat sink 26 to a die 22 in a MFD IC 2 according to a second embodiment of the present invention. The method 200 represents a first method for creating the second MFD IC heat sink assembly 32. The method 200 begins with step 202 wherein the MFD IC 2 is manufactured according to a conventional manufacturing process (or provided to the user of method 200), except that molding material 12 is not yet added to encapsulate the assembled MFD IC 2. Then, in step 204, the heat sink 26 is attached to the die 22, using any appropriate means for attaching the heat sink 26 to the die 22, such as those discussed previously. Following the attachment of the heat sink 26 to the 22, the assembled heat sink 26 and 22 are encapsulated with the molding material 12 in step 206.

Figure 11:
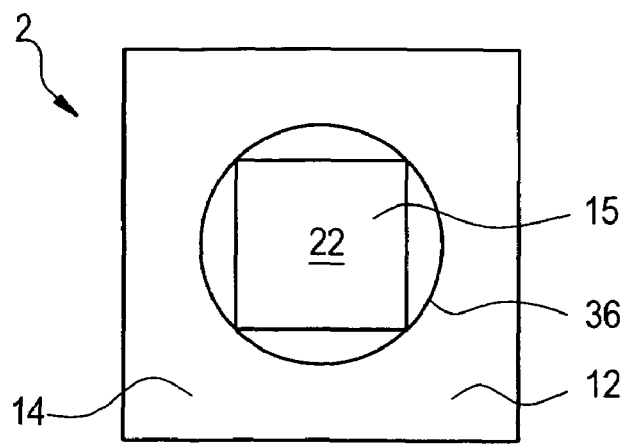
FIG. 11 illustrates a top view of a molded flip die package with a portion of the encapsulating molding material removed prior to attaching a heat sink to a die in the molded flip die package according to an embodiment of the present invention.
Figure 12:
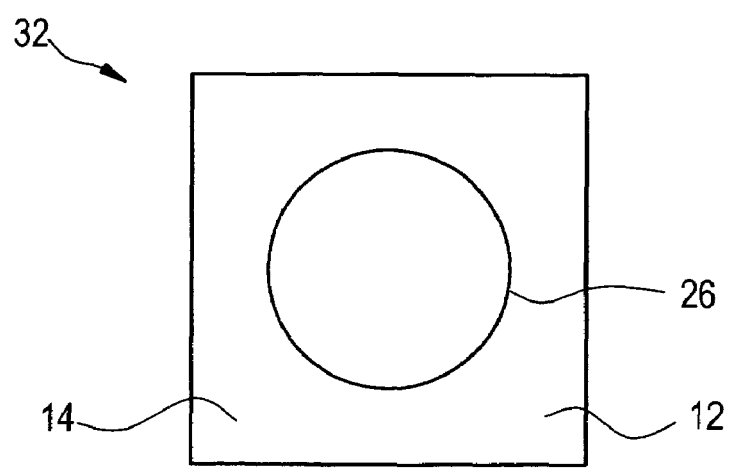
FIG. 12 illustrates a top view of the molded flip die package shown in FIG. 11 following attachment of the heat sink, in accordance with an exemplary embodiment of the present invention.
Figure 13:
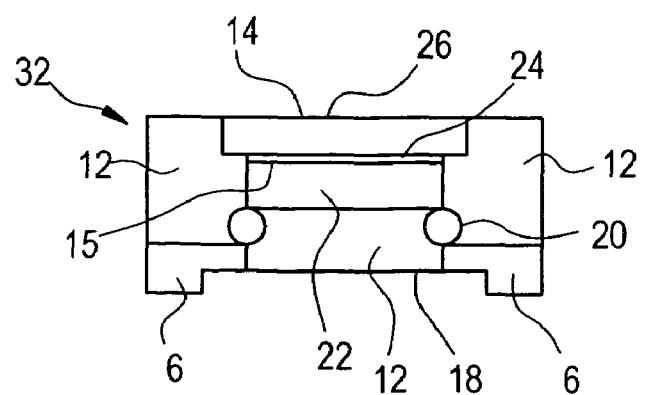
FIG. 13 illustrates a partial cross-sectional side view of molded flip die package shown in FIG. 12, in accordance with an exemplary embodiment of the present invention.

FIGS. 11-13 illustrate a MFD IC 2 that is assembled according to an alternative embodiment of the present invention. In FIG. 11, a MFD IC 2 that has been manufactured in the conventional manner is shown from a top view after a circular section of the molding material 12 (top hole 36) has been removed from above the die 22. Any of the methods described above for removing molding material 12, with some slight modifications, can be used to remove a circular section of the molding material 12 from above the die 22. An additional method is to drill the molding material 12 away from the MFD IC 2. Once the top hole 36 has been created, a heat sink 26 is attached to the top surface 15 of the die 22. The heat sink 26 can be attached to the die 22 either with or without thermal adhesive 24 (FIG. 12). Also, although the assembled MFD IC 2 as shown in FIG. 13 (which is a partial, cross-sectional, side view of the MFD IC 2 shown in FIG. 12) comprises a heat sink 24 that is flush with the top of the molding material 12, as one of ordinary skill in the art can appreciate, this need not always be the case. The finally assembled MFD IC 32, as shown in FIG. 13 (second MFD IC heat sink assembly 32), comprises a heat sink 26 attached to the top surface 15 of the die 22 by a thermal adhesive 24 applied to the bottom surface 27 of the heat sink 26 prior to attachment of the heat sink 26. The heat sink 26, with the thermal adhesive 24, is substantially flush with the top surface 14 of the second MFD IC heat sink assembly 32.

Figure 14:
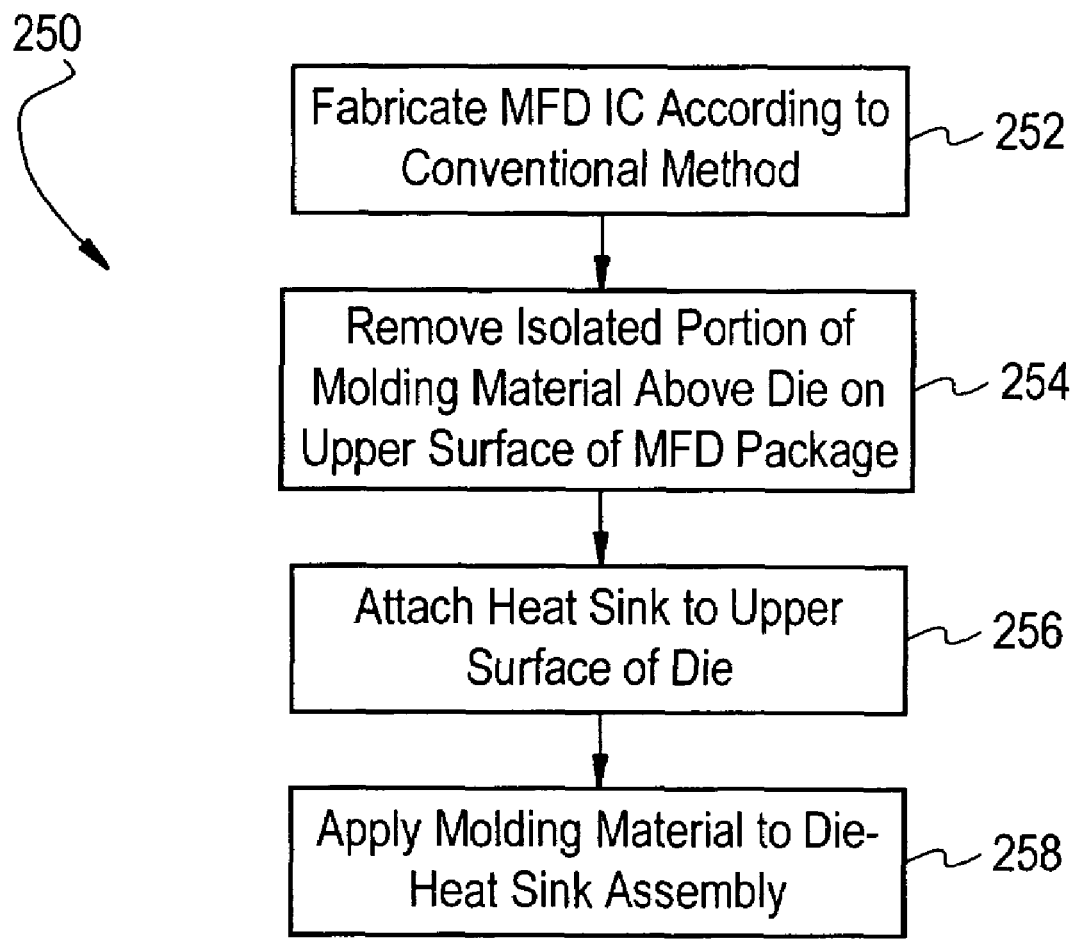
FIG. 14 illustrates a flow chart of a method for attaching a heat sink to a die in a molded flip die package according to an embodiment of the present invention.

FIG. 14 illustrates a flow chart for a method 250 to attach a heat sink 26 to a die 22 in a MFD IC 2 according to an alternative embodiment of the present invention. The method 250 represents a second method for manufacturing the second MFD IC heat sink assembly 32, and begins with step 252. In step 252, the MFD IC 2 is manufactured according to a conventional manufacturing process, wherein the entire die 22 and heat sink 26 assembly is encapsulated by the molding material 12 (or the encapsulated die 22 and heat sink 26 are provided to a user of the method 250). A top hole 36 is then removed from the MFD IC 2 according to any suitable method (such as those described above), for removing molding material 12. The die 22 and heat sink 26 assembly then resembles the assembly shown in FIG. 11.

After the MFD IC 2 is manufactured such that the top hole 36 has been removed from the molding material 12 above the die 22, the method proceeds to step 256, in which the heat sink 26 is attached to the top surface of the die 22, using any suitable means and methods for attaching the heat sink 26 to the die 22, such as those discussed above. Following step 256, molding material 12 is applied to the assembled heat sink 26 and die 22 in step 258 as necessary (i.e., to fill in gaps or spaces, if any) to create the second MFD IC heat sink assembly 32.

Figure 15:
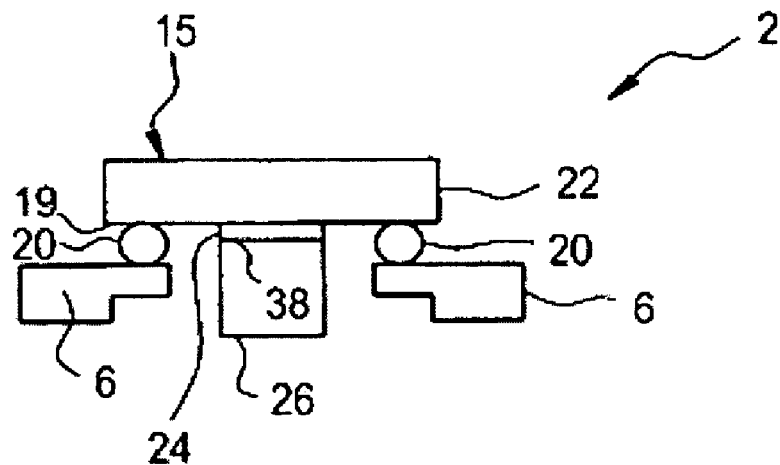
FIG. 15 illustrates a partial side view of a molded flip die package assembly prior to encapsulation by a molding material after being assembled according to an embodiment of the present invention.

FIG. 15 illustrates a partial side view of the MFD IC 2 assembly prior to encapsulation by a molding material 12 after being assembled according to an alternative embodiment of the present invention. In FIG. 15, the heat sink 26 is attached to the lower surface 19 of the die 22 prior to encapsulation with molding material 12. Although shown with thermal adhesive 24 applied between the top surface 38 of the heat sink 26 and the bottom surface 19 of the die 22, this may not always be the case, as discussed with regard to FIGS. 17 and 20. As shown in FIG. 15, however, thermal adhesive 24 has been applied to the top surface 38 of the heat sink 26 to promote the efficient transfer of heat from the die 22 to the heat sink 26, so that heat can be dissipated into the PCB. Thus, FIG. 15 represents a MFD IC 2 manufacturing process modified to incorporate the step of adding the heat sink 26 and thermal adhesive 24 prior to the step of encapsulation.

Figure 16:
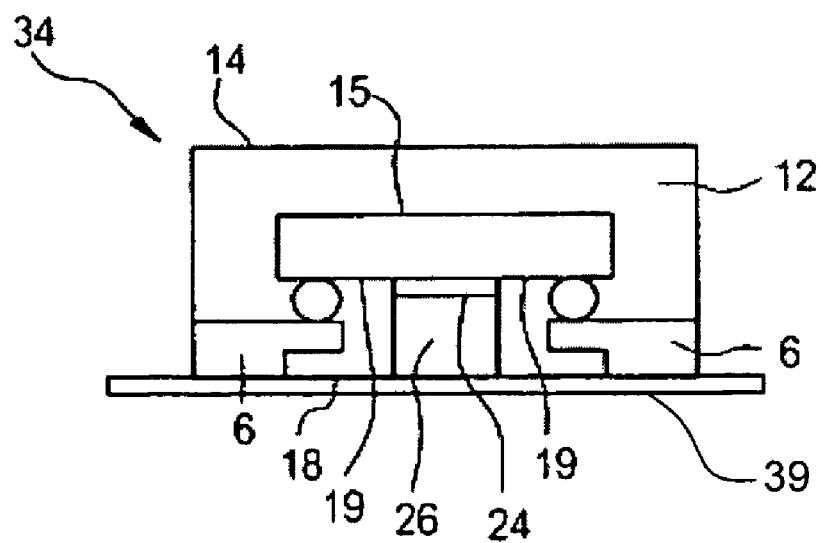
FIG. 16 illustrates a partial cross-sectional side view of the molded flip die package of FIG. 15 encapsulated by a molding material, in accordance with an exemplary embodiment of the present invention.

FIG. 16 illustrates a partial cross-sectional side view of the MFD IC 2 of FIG. 15 encapsulated by a molding material. In FIG. 16, the assembled MFD IC 2 is shown in a partial cross-sectional, side view, with several of the internal lead connections omitted for purposes of clarity. Following the assembly of the heat sink 26 and thermal adhesive 24 to the die 22, the assembled integrated circuit device is encapsulated with molding material 12. The assembled heat sink 26 and MFD IC 2 is referred to as a third MFD IC heat sink assembly 34. The molding material 12 is added, in this embodiment, so that it is substantially flush with the bottom of the heat sink 26. As one of ordinary skill in the art of the present invention can appreciate, however, this need not always be the case. In this particular exemplary embodiment of the present invention, the height o the heat sink 26 can be made to substantially match, after being attached to the bottom surface 19 of the die 22, the height dimension of a conventional MFD IC 2, so that it can be in contact with the PCB 39 to provide a heat transfer path directly from the die 22 to the PCB 39.

Figure 17:
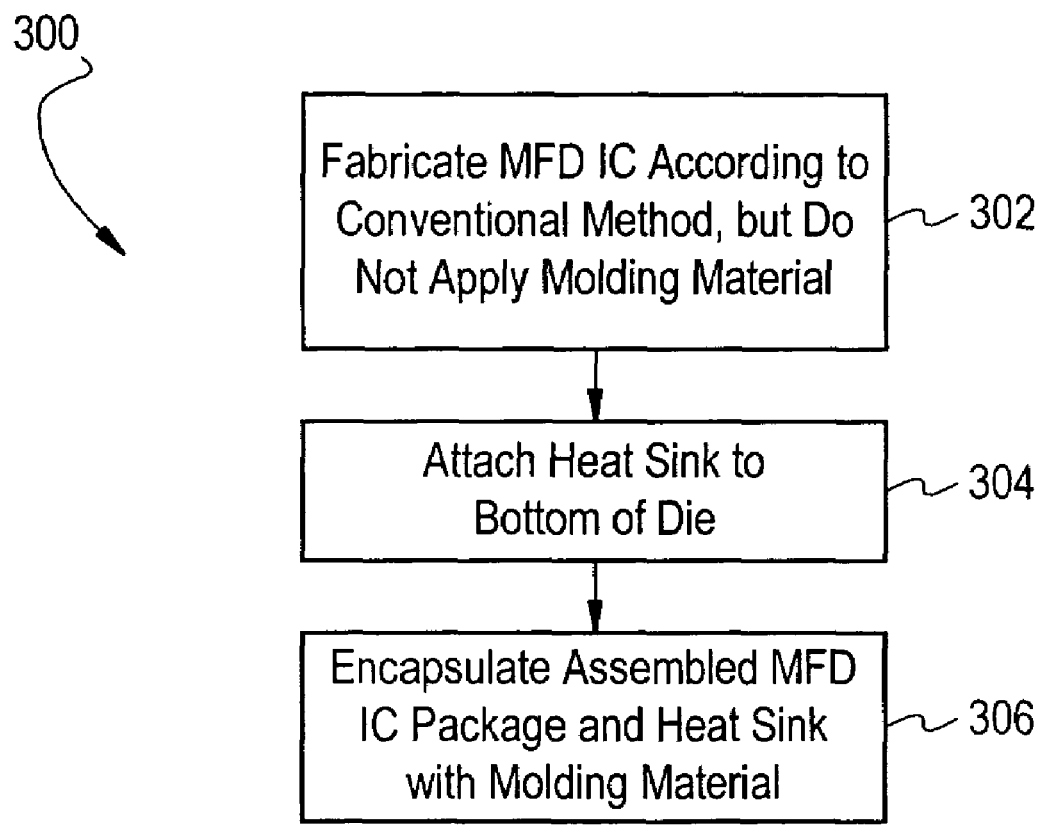
FIG. 17 illustrates a flow chart of a method for assembling a molded flip die package according to an embodiment of the present invention.

FIG. 17 illustrates a flow chart of a method 300 to attach a heat sink 26 to a die 22 in a MFD IC 2 according to a third embodiment of the present invention. The method 300 represents a first method for creating the third MFD IC heat sink assembly 34. The method 300 begins with step 302 wherein the MFD IC 2 is manufactured according to a conventional manufacturing process (or provided to a user of method 300), except that molding material 12 is not yet added to encapsulate the assembled MFD IC 2. Then, in step 304, the heat sink 26 is attached to the die 22, using any suitable means for attaching the heat sink 26 to the die 22, such as those discussed above. Following the attachment of the heat sink 26 to the die 22, the assembled heat sink 26 and die 22 are encapsulated with the molding material 12 in step 306.

Figure 18:
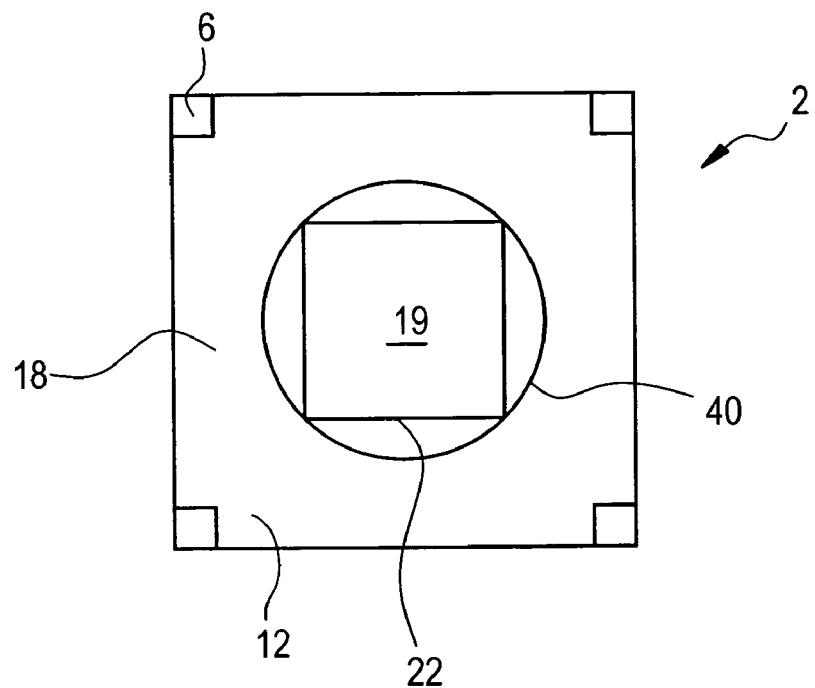
FIG. 18 illustrates a bottom view of a molded flip die package encapsulated by a molding material, then modified according to an embodiment of the present invention.
Figure 19:
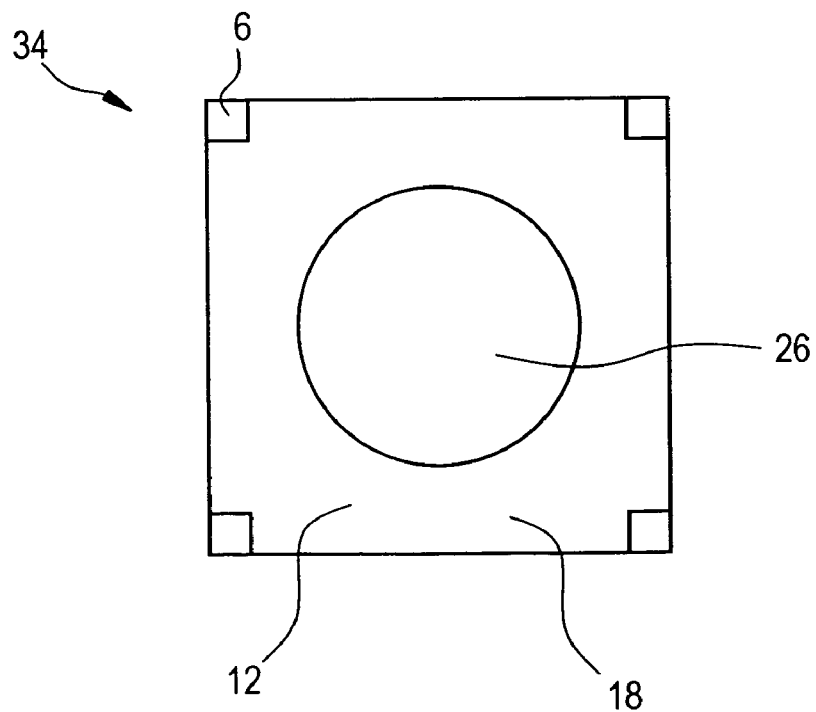
FIG. 19 illustrates a bottom view of the molded flip die package of FIG. 18, with a heat sink inserted into the hole on the bottom of molded flip die package, in accordance with an exemplary embodiment of the present invention.

FIG. 18 illustrates a bottom view of a MFD IC 2 encapsulated by a molding material, then modified according to an embodiment of the present invention. FIG. 19 illustrates a bottom view of the MFD IC 2 of FIG. 18, with a heat sink 26 inserted into a bottom hole 40 on the bottom surface 18 of the MFD IC 2. In FIG. 18, a MFD IC 2 that has been manufactured in the conventional manner is shown from a bottom view after a circular section of the molding material 12 (bottom hole 40) has been removed from below the die 22. Any of the methods described above for removing molding material 12, with some slight modifications, can be used to remove a circular section of the molding material 12 from below the die 22. An additional method can be to drill the molding material 12 away from the MFD IC 2. Once the bottom hole 40 has been created, a heat sink 26 is attached to the bottom surface 19 of the die 22. The heat sink 26 can be attached to the die 22 either with or without thermal adhesive 24 (FIG. 19).

Also, although the assembled MFD IC 2 as shown in FIG. 16 (which is a partial, cross-sectional, side view of the MFD IC 2 shown in FIG. 19) comprises a heat sink 26 that is flush with the bottom of the molding material 12, this need not always be the case as one of ordinary skill in the art can appreciate. The final assembled MFD IC 34, as shown in FIG. 16 (third MFD IC heat sink assembly 34), comprises a heat sink 26 attached to the bottom surface 19 of the die 22 by a thermal adhesive 24 applied to the top surface 38 of the heat sink 26 prior to attachment of the heat sink 26. The heat sink 26, with the thermal adhesive 24, is substantially flush with the bottom surface 18 of the third MFD IC heat sink assembly 34.

Figure 20:
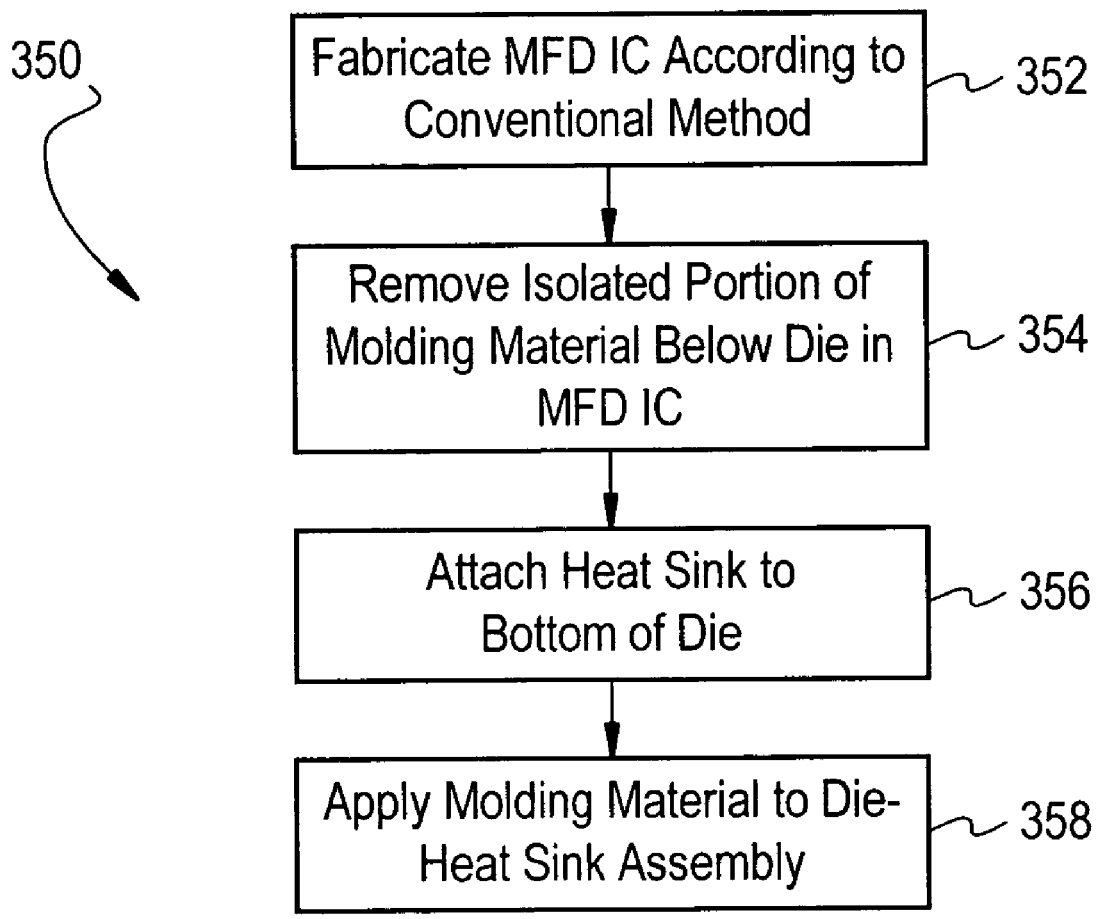
FIG. 20 illustrates a flow chart of a method for attaching a heat sink to the molded flip die package according to an embodiment of the present invention.

FIG. 20 illustrates a flow chart of a method 350 for attaching a heat sink 26 to the MFD IC 2 according to an alternative embodiment of the present invention. The method 350 represents a second method for manufacturing the third MFD IC heat sink assembly 34, and begins with step 352. In step 352, the MFD IC 2 is manufactured according to a conventional manufacturing process (or provided to a user of method 350), wherein the entire die 22 and heat sink 26 assembly is encapsulated by the molding material 12. A bottom hole 40 is then removed from the MFD IC 2 according to any suitable method (such as those described above) for removing molding material 12 (in step 354). The die 22 and heat sink 26 assembly then resembles the assembly shown in FIG. 18.

After the MFD IC 2 is manufactured such that the bottom hole 40 has been removed from the molding material 12 below the die 22, method 350 proceeds to step 356. In step 356, the heat sink 26 is attached to the bottom surface 19 of the die 22, using any suitable means and methods for attaching the heat sink 26 to the bottom surface 19 of the die 22, such as those discussed above. Following step 356, molding material 12 is applied to the assembled heat sink 26 and die 22 in step 358 as necessary (i.e., to fill in gaps or spaces, if any) to create the third MFD IC heat sink assembly 34.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A method of manufacturing a molded integrated circuit (IC) flip die package, the method comprising:
   providing a molded IC flip die encapsulated with molding material, wherein the molded IC flip die includes an integrated circuit die having a first surface and a second surface opposed to the first surface, and the molding material is formed directly on the second surface;
   exposing the second surface of the integrated circuit die in the molded IC flip die package, including removing a portion of the molding material formed directly on the second surface to expose the second surface; and
   thermally coupling a heat sink to the second surface of the integrated circuit die that is exposed by removing the portion of the molding material.

2. The method according to claim 1, wherein providing the molded IC flip die encapsulated with molding material comprises:
   providing electrical communication between portions of the first surface of the integrated circuit and one or more lead pads.

3. The method according to claim 1, wherein removing a portion of the molding material to expose the second surface of the integrated circuit die comprises:
   abrading the molding material to remove a portion of the molding material to expose the second surface of the integrated circuit die.

4. The method according to claim 3, wherein abrading the molding material comprises:
   abrading the molding material initially with a coarse grit abrasion material; and
   abrading the molding material subsequently with a finer grit abrasion material to remove a portion of the molding material to expose the second surface of the integrated circuit die.

5. The method according to claim 1, wherein removing the portion of the molding material to expose the second surface of the integrated circuit die comprises:
   removing the portion of the molding material with a removing apparatus selected from the group consisting of a laser, a drill, and a chemical to expose the second surface of the integrated circuit die.

6. The method according to claim 5, wherein removing the portion of the molding material with a laser comprises:
   (e) ablating the portion of molding material with the laser.

7. The method according to claim 5, wherein removing the portion of the molding material with a laser comprises:
   shearing off the portion of molding material with the laser.

8. The method according to claim 5, wherein removing a portion of the molding material with a chemical comprises:
   removably etching the portion of molding material with the chemical.

9. The method according to claim 1, further comprising:
   electrically bonding the encapsulated integrated circuit package to a printed circuit board, wherein the heat sink is thermally coupled to the second surface of the integrated circuit die, such that the heat sink is in thermal contact with the printed circuit board.

10. The method according to claim 1, wherein thermally coupling a heat sink to the exposed integrated circuit die comprises:
    attaching the heat sink to the integrated circuit die via thermally coupling selected from the group consisting of thermally adhering, thermally gluing, thermally taping, and mechanically coupling.

11. The method according to claim 10, wherein attaching the heat sink by mechanically coupling comprises:
    press fitting the heat sink to the molded IC flip die package.

12. The method according to claim 10, wherein attaching the heat sink by mechanically coupling comprises:
    screwing the heat sink to the molded IC flip die package.

13. The method according to claim 1, wherein the molded IC flip die package is selected from the group consisting of a ball gate array and a quad flat no-lead package.

14. The method according to claim 1 wherein the molding material formed directly on the second surface completely covers the second surface.

* * * * *